United States Patent [19]
Halvis et al.

[11] Patent Number: 5,369,040
[45] Date of Patent: Nov. 29, 1994

[54] METHOD OF MAKING TRANSPARENT POLYSILICON GATE FOR IMAGING ARRAYS

[75] Inventors: James Halvis, Severna Park; Nathan Bluzer, Rockville; Robert R. Shiskowski, Glen Burnie; Li-Shu Chen, Ellicott City, all of Md.

[73] Assignee: Westinghouse Electric Corporation, Pittsburgh, Pa.

[21] Appl. No.: 58,629

[22] Filed: Apr. 12, 1993

Related U.S. Application Data

[63] Continuation of Ser. No. 884,974, May 18, 1992, abandoned.

[51] Int. Cl.⁵ .......................... H01L 31/18
[52] U.S. Cl. ........................ 437/3; 437/4; 437/53; 437/100; 257/225; 257/290; 257/291
[58] Field of Search .............. 357/24, 30, 59; 257/225, 231, 249, 290, 291, 412; 437/3, 4, 53, 100; 148/DIG. 148

[56] References Cited

U.S. PATENT DOCUMENTS

| | | | |
|---|---|---|---|
| 4,113,515 | 9/1978 | Kooi et al. | 357/24 |
| 4,189,826 | 2/1980 | Smith | 357/24 |
| 4,352,237 | 10/1982 | Widmann | 357/24 |
| 4,780,394 | 10/1988 | Blanchard et al. | 357/24 |
| 4,963,953 | 10/1990 | Blanchard et al. | 357/24 |

FOREIGN PATENT DOCUMENTS

| | | | |
|---|---|---|---|
| 0220120 | 4/1987 | European Pat. Off. | 437/53 |
| 61-296361 | of 0000 | Japan. | |
| 0050981 | 5/1978 | Japan | 437/53 |
| 0204165 | 12/1982 | Japan | 437/53 |
| 0260542 | 10/1990 | Japan | 437/53 |

OTHER PUBLICATIONS

IEEE Transactions on Electron Devices, vol. 38, No. 8, Aug. 1991, S. Manabe, et al., "A 2-Million-Pixel CCD Image Sensor Overlaid with an Amorphous Silicon Photoconverstion Layer".

IEEE Electron Device Letters, vol. EDL-8, No. 8, Aug. 1987, H. Tsai, et al., "An Amorphous SiC/Si Two-Color Detector".

IEEE Electron Device Letters, vol. EDL-8, No. 2, Feb. 1987, K. C. Chang, et al., "The Amorphous Si/SiC Heterojunction Color-Sensitive Phototransistor".

*Primary Examiner*—R. Bruce Breneman
*Assistant Examiner*—Ramamohan Rao Paladugu
*Attorney, Agent, or Firm*—G. R. Jarosik

[57] ABSTRACT

An improved MOS photodetector having polysilicon gate material which is made more transparent to visible light by the addition of up to 50% carbon, and preferably about 10% carbon. The surfaces of the polysilicon-carbon gates are oxidized to form a silicon dioxide dielectric layer, thus eliminating the need to deposit a separate dielectric layer for isolation of adjacent gates in an overlapping gate array. The elimination of a separate dielectric layer permits all gates to be formed directly on the substrate dielectric layer, thus providing a uniform drive voltage requirement across the array.

7 Claims, 4 Drawing Sheets

METHOD OF MAKING TRANSPARENT POLYSILICON GATE FOR IMAGING ARRAYS

This application is a continuation of application Ser. No. 07/884,974 filed May 18, 1992, now abandoned.

BACKGROUND OF THE INVENTION

Imaging arrays for detecting electromagnetic radiation are well known in the art. For example, charge coupled device (CCD) imaging arrays are used in camera recording devices. Improved quantum efficiency, which results in improved response to low light levels, is a desirable performance feature which manufacturers attempt to optimize in such devices.

The quantum efficiency of an imaging array is directly affected by the transmissivity of the material through which the radiation must pass prior to entering the active absorber layer of the imaging device. For example, in a MOS imaging array, light must pass through the gate material prior to being absorbed in the active area of the substrate located below the gate. Polysilicon is used extensively for forming gates for visible imaging arrays even though visible radiation is inherently absorbed in the polysilicon material. To minimize the absorption loss, polysilicon layer thicknesses are used which are less than the absorption depth of most of the visible radiation spectrum. However, even with layers of polysilicon less than 5000 Angstroms thick, the quantum efficiency of such devices is significantly degraded. Transmission of the blue portion of the spectrum is especially poor.

For high performance applications, transparent gate materials have been developed, for example tin oxide and indium tin oxide. These materials are transparent throughout the visible spectrum, however, there are fabrication difficulties associated with their use. These materials require a dielectric layer to isolate adjacent gates, as shown in FIG. 1, where adjacent gates 1 through 5 are separated by dielectric layer 7. Imperfections in the deposited dielectric layer 7 reduce the yield of the fabrication process, since any pin holes will result in gate to gate shorts. The presence of dielectric layer 7 also creates a problem because it is not formed under all of the gates. In FIG. 1, gates 1, 3 and 5 are formed on a thermally grown gate dielectric layer 6 of silicon dioxide or silicon dioxide and silicon nitride. Gates 2 and 4, however, are formed over not only layer 6 but also the dielectric layer 7. Therefore, the drive voltage required for gates 2 and 4 is higher than that for gates 1, 3 and 5. This difference complicates the design and operation of the circuitry which interfaces with the device.

An alternative approach to improving the quantum efficiency of these high performance visible imagers is to thin the array's substrate after device fabrication, and to illuminate the array from the back side. The substrate is typically thinned to ten microns or less. This technique circumvents the gate absorption issue, but it presents difficulties in achieving reliable and uniform processes for thinning, for backside passivation and for connecting to the front surface.

The above materials and fabrication techniques have been known in the art for a decade or more. However, there has been a continued need for improved performance with photodetectors, particularly in low light applications, and for improved sensitivity in the blue portion of the visible spectrum. With the advent of high definition television, there is an even increased commercial demand for small, highly efficient detectors which can be produced at a reasonable cost. Existing technologies nave had difficulties satisfying this demand.

SUMMARY OF THE INVENTION

In light of the limitations of the prior art, it is an object of this invention to describe a photodetector for a visible imaging array which has improved quantum efficiency when compared to prior art devices. It is a further object of this invention to provide a photodetector with improved response in the blue portion of the visible spectrum. It is a further object of this invention to provide an improved gate design for a photodetector which can be fabricated with standard MOS fabrication techniques. It is a further object of this invention to provide an imager gate array where the drive voltage required for all gates is uniform.

Therefore, this invention describes a MOS photodetector which has gates fabricated from polysilicon with the addition of carbon, also described herein as polysilicon-carbon, which makes the gate material more transparent to the visible portion of the energy spectrum than in prior art devices. The use of polysilicon-carbon as the gate material eliminates the need for a separate dielectric layer for isolating adjacent gates from each other, because the gates can be separated by a layer of silicon dioxide formed by oxidizing the polysilicon-carbon gates. Furthermore, all gates in an array can be formed directly onto the gate dielectric layer, thus providing uniform drive voltage requirements across the array. Photosensing detectors built in accordance with this invention can be fabricated using standard, high yield, silicon processing techniques, thus providing a low cost, high performance detector.

DETAILS OF THE INVENTION

The effective energy bandgap $E_g$ of a semiconductor can be altered by dopants which replace atoms within the crystal structure. By adding carbon to silicon, the effective bandgap of the material can be increased. The effective bandgap of silicon with the addition of carbon can be estimated by a linear approximation as follows:

$$E_g(\text{effective}) = [C][E_g(\text{carbon})] + [1-C][E_g(\text{silicon})]$$

where $C = \%$ carbon, $E_g(\text{carbon}) = 6$ eV, and $E_g(\text{silicon}) = 1.12$ eV.

Figure 2:
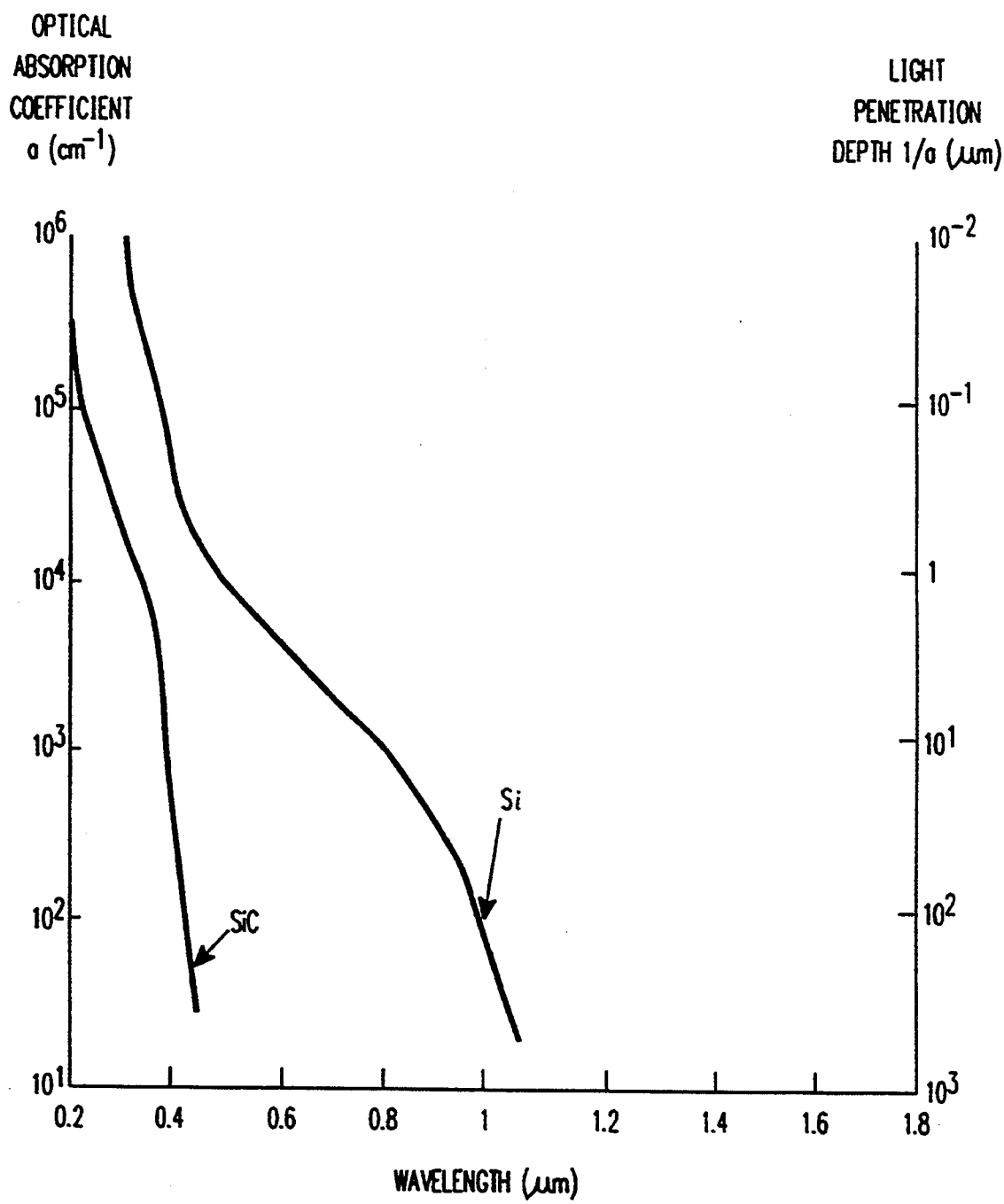
FIG. 2 is a graph of the optical absorption properties of silicon and silicon carbide as a function of wavelength.

It would be very difficult to model such a system precisely, however, this simple linear approximation model does predict the optical cutoff of silicon carbide (50% carbon) to within approximately 0.1 micron, as shown by FIG. 2, which illustrates the optical absorption of both silicon and silicon carbide.

The longwave cutoff of a semiconductor crystal is approximately $1.24/E_g$. For wavelengths beyond the optical cutoff value, the material is transparent. Table 1 shows the cutoff values resulting from the incorporation of various amounts of carbon in silicon.

TABLE 1

| C (% carbon) | Effective $E_g$ (eV) | Cutoff (microns) |
|---|---|---|
| 0 | 1.12 | 1.11 |
| 1 | 1.17 | 1.06 |
| 5 | 1.36 | 0.91 |
| 10 | 1.61 | 0.77 |
| 16 | 1.90 | 0.65 |
| 20 | 2.10 | 0.59 |

Table 1 shows that only a small percentage of carbon is effective to reduce the longwave cutoff of silicon an appreciable amount. Furthermore, this effect is nonlinear, with the initial amounts of carbon providing the largest impact on the longwave cutoff, e.g. the addition of 16% carbon provides approximately 50% of the shift in optical cutoff. This effective bandgap widening shifts the absorption curve of the material to the left in FIG. 1, toward the silicon carbide curve, thus yielding a reduced optical absorption coefficient for the visible energy wavelengths. A polysilicon-carbon layer with approximately 10% carbon is significantly more transparent to visible light than with polysilicon alone, and the depth of penetration of even the blue portion of the spectrum would exceed the 0.5 micron thickness of a typical detector gate. Thus for a 0.5 micron thickness gate application, the 10% polysilicon-carbon material is essentially transparent to visible light.

Figure 3:
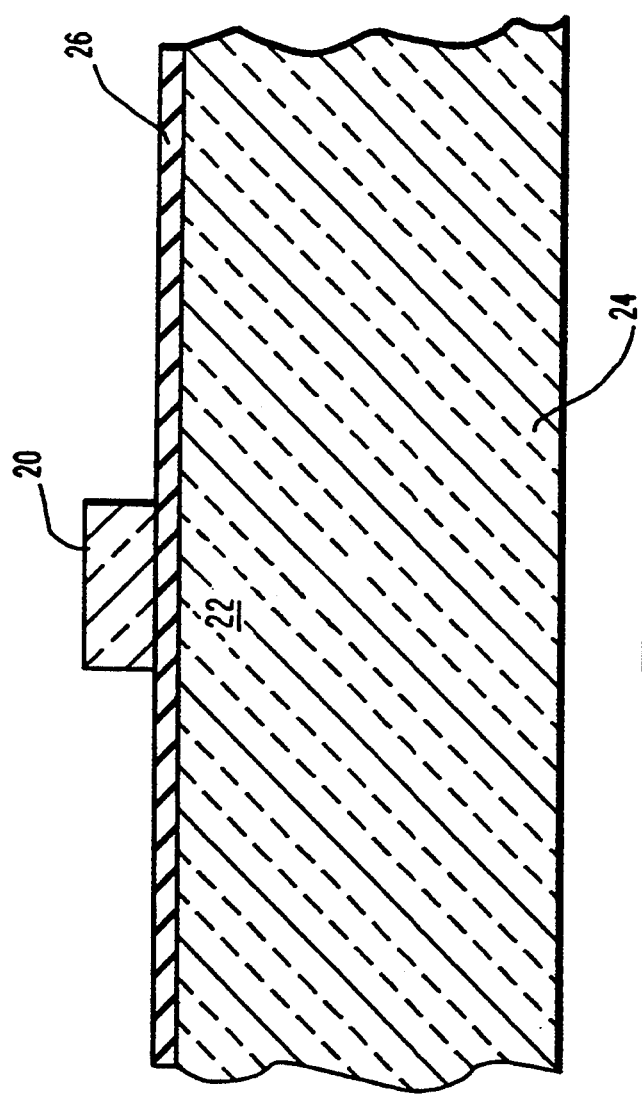
FIG. 3 is a MOS photodetector built in accordance with this invention.

By adding carbon to the polysilicon material of a MOS photodetector device, the amount of visible light absorbed by the gate material can be reduced, and the quantum efficiency of the detector can thereby be improved. A MOS device incorporating this invention is illustrated in FIG. 3, where a gate 20 is formed over an active photon absorbing area 22 in a silicon substrate 24. A dielectric layer 26 provides electrical isolation between the gate 20 and substrate 24. The gate material is polysilicon-carbon. The amount of carbon added to the silicon can be between 0% and 50%, and is typically less than 20%. The amount of carbon added may, for example, be approximately 10%.

Carbon can be added to the gate material of a MOS photodetector during polysilicon growth by adding methane to the silane feed gas. Alternatively, ion implantation may be used. With a polysilicon thickness of 4000 Angstroms, an implant dose of $2 \times 10^{17}$ atoms/cm$^2$ would be required to provide approximately 10% carbon content and a shift in cutoff wavelength from 1.11 microns to 0.77 microns. This 0.34 micron shift would make a 4000 Angstrom polysilicon gate considerably more transparent throughout the visible spectrum than without the addition of the carbon. A dose of $2 \times 10^{17}$ atoms/cm$^2$ is readily attainable with ion implanters capable of 1 mA or greater current. No change in polysilicon processing techniques is anticipated with the addition of this amount of carbon. For a photodetector array, only one additional process step per polysilicon layer is required when compared to standard polysilicon gate processing.

Figure 1:
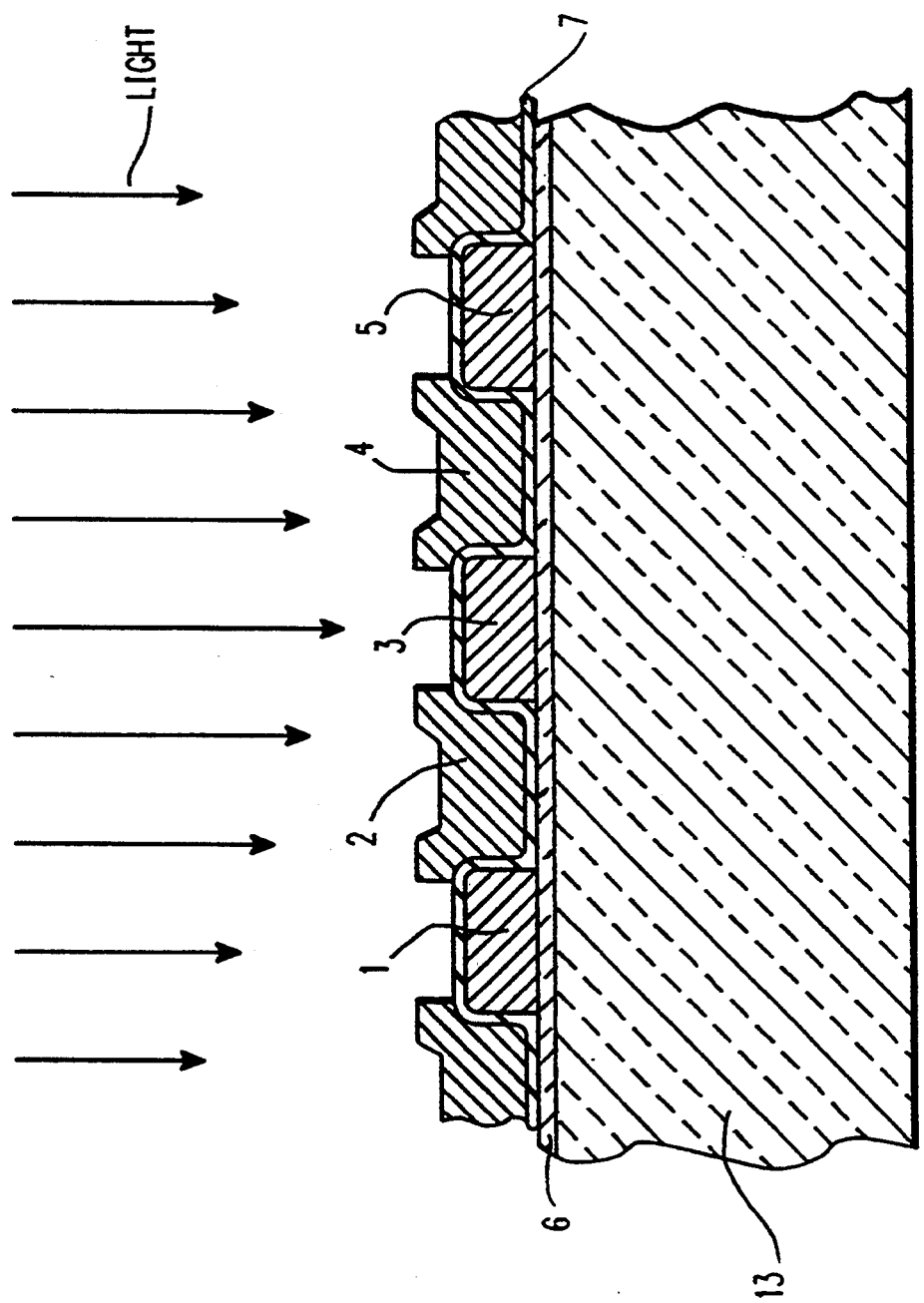
FIG. 1 illustrates a prior art photosensing array having transparent gates and a separate dielectric layer for isolation of adjacent gates.
Figure 4A:
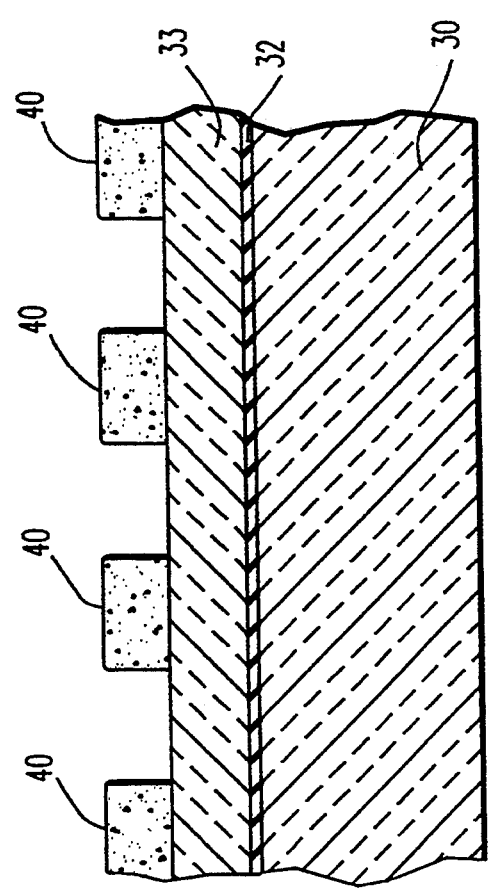
FIGS. 4A–4C illustrate the sequence of steps in the fabrication of a photodetector array built in accordance with this invention.
Figure 4B:
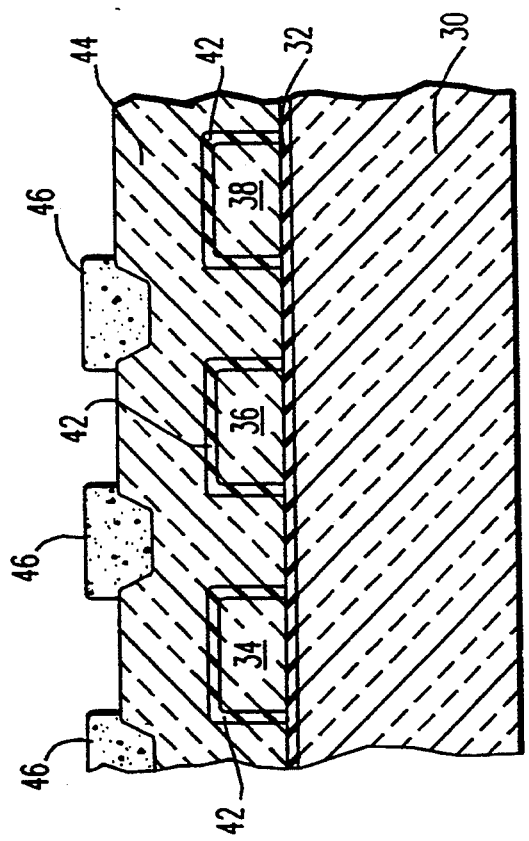
Figure 4C:
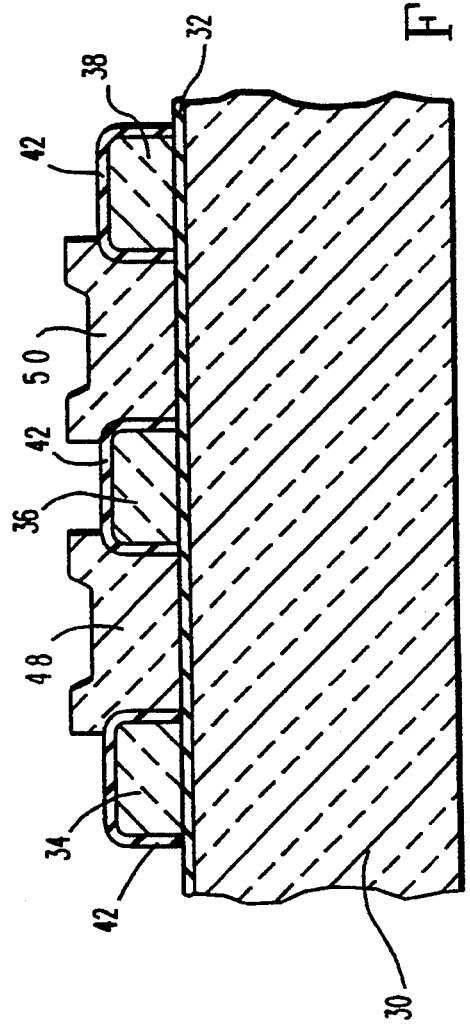

The use of polysilicon-carbon as a transparent gate material facilitates the fabrication of overlapping gate array detectors. FIGS. 4A–4C illustrate the process of fabricating a multi-gate array in accordance with this invention. Similar structures are numbered consistently in FIGS. 4A–4C. A semiconductor substrate 30, such as silicon, is formed as an active photon absorber. A gate dielectric layer 32 is formed on the substrate; for example, by oxidizing the surface of a silicon substrate 30 to form a silicon dioxide layer 32. Silicon dioxide plus silicon nitride may also be used as the gate dielectric layer 32. A layer of polysilicon-carbon 33 is then deposited over the dielectric layer 32, as shown in FIG. 4A. A first array of gates is defined by a resist pattern 40. The exposed areas of the polysilicon-carbon layer 33 are removed by processes well known in the art to form a first array of gates 34, 36, 38, as shown in FIG. 4B. Because the gates are formed from $Si_{1-x}C_x$, where x is between 0.0 and 0.5, and typically less than 0.2 it is unnecessary to deposit a separate material to provide electrical isolation for the gates. Once the resist is removed, the gate surfaces can be oxidized to form an insulating layer of silicon dioxide 42 on each of the individual gates. A second layer of polysilicon-carbon 44, also formed from $Si_{1-x}C_x$, where x is between 0.0 and 0.5, is then deposited over the first array of gates. This is followed by another resist pattern 46 for the definition of a second array of gates 48, 50, as shown in FIG. 4C. The second array of gates is formed by removal of the exposed portions of the second layer of polysilicon-carbon 44 by well known techniques. Note that this second array of gates is deposited on the same gate dielectric layer 32 as the first array of gates. As a result, all of the gates have the same electrical effect on the substrate and can be driven at the same voltage level. This feature simplifies the circuitry associated with the detector array when compared to prior art overlapping gate arrays which have dissimilar dielectrics under the two gate array patterns, as illustrated in FIG. 1.

Because the adjacent gates are separated by only the thin layer of silicon dioxide 42, charges can be transported across the substrate 30 through sequential control of the gate voltages without having to pass through areas of the substrate 30 which are not under the influence of a gate. This feature, along with the transparency of the $Si_{1-x}C_x$ gate material, results in a very efficient detector device. Because there is no need for special materials or processes in the fabrication of this device, the cost of production is reduced when compared to prior art tin oxide, indium tin oxide, and back etched devices. Furthermore, higher device yield is obtained by eliminating the need to deposit a separate insulating layer between the two arrays of gates.

The above descriptions are provided by way of example only and should not be interpreted to limit the scope of the invention as claimed below.

We claim as our invention:

1. A method of making a transparent polysilicon gate, comprising the steps of: forming an active photon absorber from a semiconductor substrate;

forming a gate dielectric layer on said active photon absorber;

depositing a first layer of polysilicon-carbon over said gate dielectric layer;

defining a first array of gates by placing a first resist pattern over said first layer of polysilicon-carbon whereby portions of said first layer of polysilicon-carbon are exposed;

forming said first array of gates by removing said exposed polysilicon-carbon in said first resist pattern;

removing said first resist pattern;

forming an insulating layer on said first array of gates;
depositing a second layer of polysilicon-carbon over said first array of gates;
defining a second array of gates by placing a second resist pattern over said second layer of polysilicon-carbon whereby portions of said second layer of polysilicon-carbon are exposed; and
forming said second array of gates by removing said exposed polysilicon-carbon in said second resist pattern.

2. The method as recited in claim 1, wherein said first layer of polysilicon-carbon comprises $S_{1-x}C_x$, where x is greater than 0.0 and less than 0.5.

3. The method as recited in claim 2, wherein said second layer of polysilicon-carbon comprises $S_{1-x}C_x$, where x is greater than 0.0 and less than 0.5.

4. The method as recited in claim 3, wherein said semiconductor substrate comprises silicon.

5. The method as recited in claim 4, wherein said gate dielectric layer comprises silicon dioxide.

6. The method as recited in claim 4, wherein said gate dielectric layer comprises silicon dioxide and silicon nitride in combination.

7. The method as recited in claim 4, wherein said insulating layer is formed by oxidizing the surface of said first array of gates.

* * * * *